US008503191B2

(12) United States Patent
Nagata et al.

(10) Patent No.: US 8,503,191 B2
(45) Date of Patent: Aug. 6, 2013

(54) SHIELD COVER, SHIELD CASE, AND CIRCUIT BOARD MODULE

(75) Inventors: Takayuki Nagata, Yao (JP); Takahisa Ohtsuji, Yao (JP)

(73) Assignee: Hosiden Corporation, Yao-Shi (JP)

( * ) Notice: Subject to any disclaimer, the term of this patent is extended or adjusted under 35 U.S.C. 154(b) by 136 days.

(21) Appl. No.: 12/861,186

(22) Filed: Aug. 23, 2010

(65) Prior Publication Data

US 2011/0085317 A1 Apr. 14, 2011

(30) Foreign Application Priority Data

Oct. 13, 2009 (JP) ................................ 2009-235899

(51) Int. Cl.
*H05K 9/00* (2006.01)

(52) U.S. Cl.
USPC ............................ 361/818; 361/799; 361/816

(58) Field of Classification Search
USPC ........ 361/728–730, 799, 816, 818; 174/35 R, 174/51, 357
See application file for complete search history.

(56) References Cited

U.S. PATENT DOCUMENTS

| | | | | |
|---|---|---|---|---|
| 5,603,620 | A * | 2/1997 | Hinze et al. | 439/95 |
| 6,089,882 | A * | 7/2000 | Costello | 439/95 |
| 6,139,365 | A * | 10/2000 | Lok | 439/607.01 |
| 6,162,086 | A * | 12/2000 | Kuo | 439/497 |
| 6,276,965 | B1 * | 8/2001 | Madsen et al. | 439/607.01 |
| 6,731,518 | B2 * | 5/2004 | Suzuki et al. | 361/818 |
| 7,113,410 | B2 * | 9/2006 | Pawlenko et al. | 361/818 |
| 7,547,217 | B1 | 6/2009 | Lin | 439/76.1 |
| 7,572,145 | B1 * | 8/2009 | Wu | 439/607.02 |
| 2002/0142656 | A1 | 10/2002 | Chang | 439/607 |
| 2002/0191384 | A1 | 12/2002 | Wei | 361/799 |
| 2008/0045056 | A1 * | 2/2008 | Collantes et al. | 439/131 |
| 2008/0070439 | A1 | 3/2008 | Kusuda et al. | 439/540.1 |
| 2008/0166918 | A1 | 7/2008 | Yang et al. | 439/608 |
| 2010/0151731 | A1 * | 6/2010 | Su et al. | 439/607.35 |
| 2010/0151732 | A1 * | 6/2010 | Xu et al. | 439/607.45 |

FOREIGN PATENT DOCUMENTS

| | | |
|---|---|---|
| EP | 0 998 178 A1 | 5/2000 |
| JP | 3-32498 | 3/1991 |
| JP | 2008-27975 | 2/2008 |
| JP | 2009-123500 A1 | 6/2009 |

OTHER PUBLICATIONS

Extended European Search Report issued on Feb. 10, 2011 for counterpart European patent application No. 10251553.3.
Japanese Office Action mailed Jun. 4, 2013, with English translation, in counterpart Japanese Application No. 2009-235899.

* cited by examiner

*Primary Examiner* — Hung S Bui
(74) *Attorney, Agent, or Firm* — Kratz, Quintos & Hanson, LLP

(57) ABSTRACT

The invention provides a shield cover adapted to cover at least a first electronic component mounted on a first surface of a circuit board. The first electronic component has a metal shell or has a ground/earth terminal on a lateral surface thereof. The shield cover has a contact portion being elastically contactable with a lateral surface of the metal shell or the ground/earth terminal of the first electronic component.

26 Claims, 6 Drawing Sheets

SHIELD COVER, SHIELD CASE, AND CIRCUIT BOARD MODULE

The present application claims priority under 35 U.S.C. §119 of Japanese Patent Application No. 2009-235899 filed on Oct. 13, 2009, the disclosure of which is expressly incorporated by reference herein in its entity.

BACKGROUND OF THE INVENTION

1. Technical Field

The present invention relates to a shield cover capable of covering at least a first electronic component mounted on a first surface of a circuit board. The invention also relates a shield case and a circuit board module provided with the shield cover.

2. Background Art

A conventional shield case as disclosed in Japanese Unexamined Patent Publication No. 2009-123500 covers a whole circuit board with a connecter (electronic component) mounted thereon in order to enhance electromagnetic interference (EMI) characteristics. This shield case has a contact portion to be connected to the top surface of a metal shell of the connector by soldering or by screwing.

CITATION LIST

Patent Literature 1: Japanese Unexamined Patent Publication No. 2009-123500

SUMMARY OF INVENTION

However, in order to connect the contact portion of the shield case to the top surface of the metal shell of the connector by soldering or by a screw, it is inevitable to do bothersome work of soldering or screwing, which leads to increased costs. Moreover, the shield case may be of large height because of the configuration that the contact portion is connected to the top surface of the metal shell of the connector.

In view of the above circumstances, the present invention provides a shield caver, a shield case, and a circuit board module that can obviate soldering work and screw clamp work, and that are reduced in height.

In view of the above-described problems, a shield cover of the present invention is to cover at least a connector mounted on a first surface of a circuit board. The connector has a metal shell. The shield cover has a contact portion being elastically contactable with a first lateral surface of the metal shell of the connector.

In this aspect of the invention, the contact portion is elastically contactable with the first lateral surface of the metal shell, obviating soldering or screwing work for connecting the contact portion to the metal shell. Consequently, the connection work of the contact portion becomes remarkably simplified, leading to reduced cost. Moreover, the contact portion, elastically contactable with the first lateral surface of the metal shell, a top plate of the shield cover can be disposed close to the connector. Consequently, the shield cover can be minimized in height dimension.

The metal shell may further include a second lateral surface that is opposite from the first lateral surface. The shield cover may have a pair of the contact portions, which may be elastically contactable with the first and second lateral surfaces of the metal shell from opposite sides of the connector. In this case, since the contact portions elastically contact with the lateral surfaces of the metal shell from opposite sides of the connector to sandwich the connector, the electric connection of the contact portions with the lateral surfaces of the metal shell of the connector is improved in stability and reliability.

The shield cover may further have a cover body of a generally U shape in cross-sectional view. The cover body may include a pair of side walls, each of which has first and second ends, and a top plate bridging between the first ends of the side walls. The contact portion may be a plate spring extended from the second end of one of the side walls of the cover body and folded back toward the top plate of the cover body. This aspect of the invention having the contact portion being a plate spring extended from the second end of one of the side walls of the cover body is advantageous over the prior art, particularly compared to a case where the contact portion is formed by cutting out and raising a portion of the cover body such that a cutout portion is formed in the cover body, because electromagnetic waves occurring from the first electronic component or other components are less likely to leak from the shield cover.

The shield cover may have a shape adapted to cover the first surface of the circuit board.

A first shield case of the present invention includes the above-described shield cover, and a shield member to cover a second surface of the circuit board, the second surface being an opposite surface to the first surface of the circuit board. A second shield case of the present invention includes the above-described shield cover, and a shield member to cover at least an electronic component mounted on a second surface of the circuit board, the second surface being an opposite surface to the first surface of the circuit board.

The first or second shield case may further includes locking means for locking the shield cover to the shield member with the circuit board sandwiched therebetween.

A first circuit board module of the present invention includes the above-described shield cover or the above-described first shield case, the connector having the metal shell, and the circuit board having the first surface on which the connector is mounted.

A second circuit board module of the present invention includes the above-described second shield case, the connector having the metal shell, the electronic component, and the circuit board having the first surface on which the connector is mounted and the second surface on which the electronic component is mounted, the second surface being an opposite surface to the first surface of the circuit board.

A female or male connector may be used as the connector. The first or second circuit board module may further include a cable. The cable may be connected to the connector or may be connected to the connector via a conductive line on the circuit board.

In the case where at least two connectors are mounted on the first surface of the circuit board, one of the connectors may be a female connector, and the other connector may be a male connector.

The shield case may be covered by a case made of insulating resin.

DESCRIPTION OF EMBODIMENTS

Figure 1:
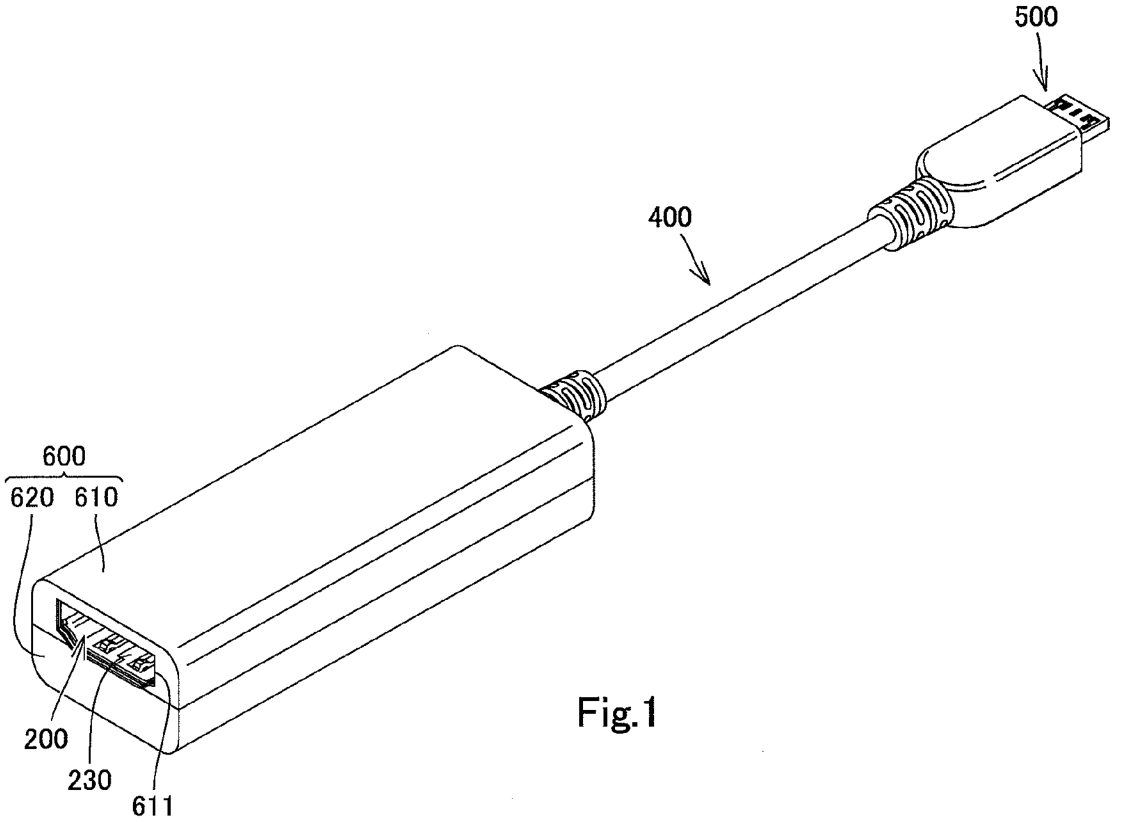
FIG. 1 is a schematic perspective view of a circuit board module according to an embodiment of the present invention.

Hereinafter, a circuit board module according to an embodiment of the present invention will be described with reference to FIGS. 1 to 4. The circuit board module shown in FIGS. 1 to 4 is a relay device for inputting and outputting digital signals at a high transmission frequency in the range of several tens of MHz to several GHz). The circuit board module is proof against electromagnetic interference (EMI). This circuit board module includes a circuit board 100, a female connector 200, a shield case 300, a cable 400, a male connector 500 and a resin case 600. These respective components will be described in detail below.

The circuit board 100 is a well-known printed circuit board having a first surface 101 and a second surface 102, as shown in FIGS. 2A to 4. On the first surface 101 of the circuit board 100 is mounted the female connector 200. Although not shown, the first surface 101 is further provided with a plurality of input/output terminals, conductive lines to transmit digital signals, and an IC and other electronic devices. The second surface 102 of the circuit board 100 is the back side of the first surface 101. The conductive lines connect between the input/output terminals and contacts 220*a*, 220*b* of the female connector 200.

Figure 2A:
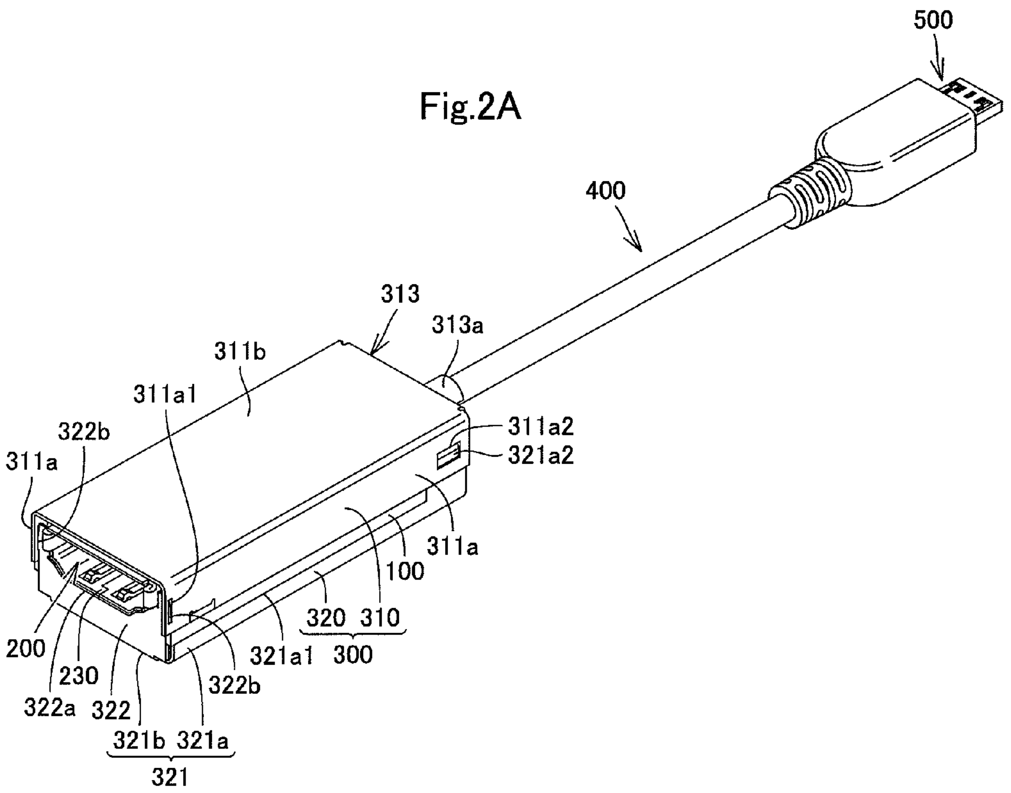
FIG. 2A is a schematic perspective view of the circuit board module with its resin case removed.
Figure 2B:
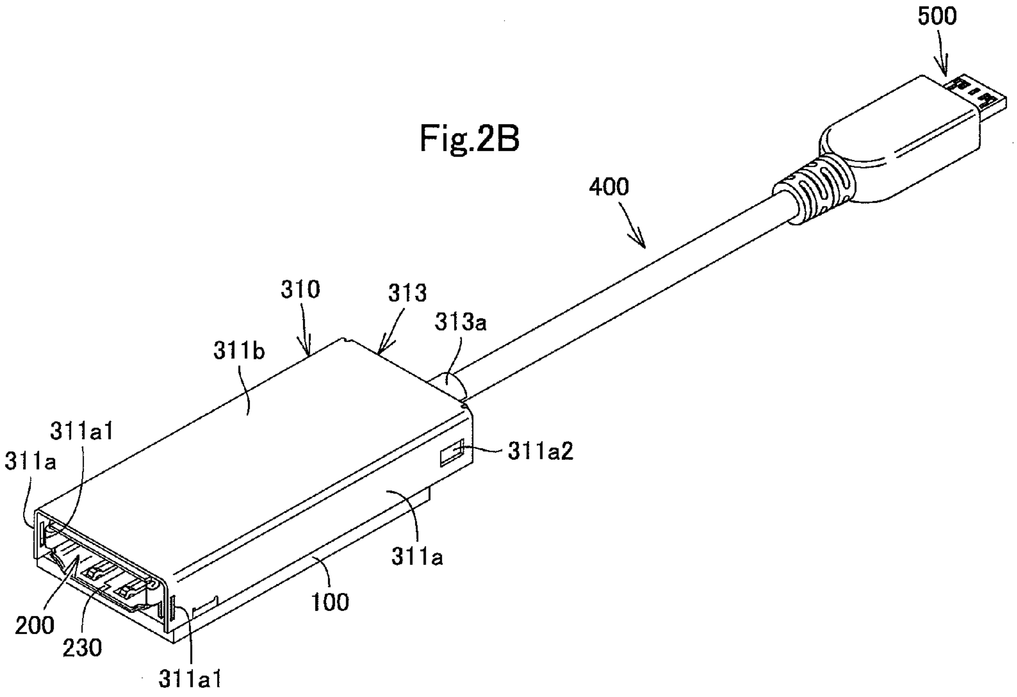
FIG. 2B is a schematic perspective view of the circuit board module with its shield member further removed.

The cable 400 is a well-known cable (e.g. bulk cable) having a plurality of lead wires to transmit the above-described digital signals, as shown in FIGS. 1, 2A and 2B. At an lengthwise end of the cable 400, their lead wires are striped to take out their core wires. The core wires are connected to the input/output terminals by soldering. The other lengthwise end of the cable 400 is connected to the male connector 500. The above-described digital signals are inputted to the male connector 500.

Figure 3A:
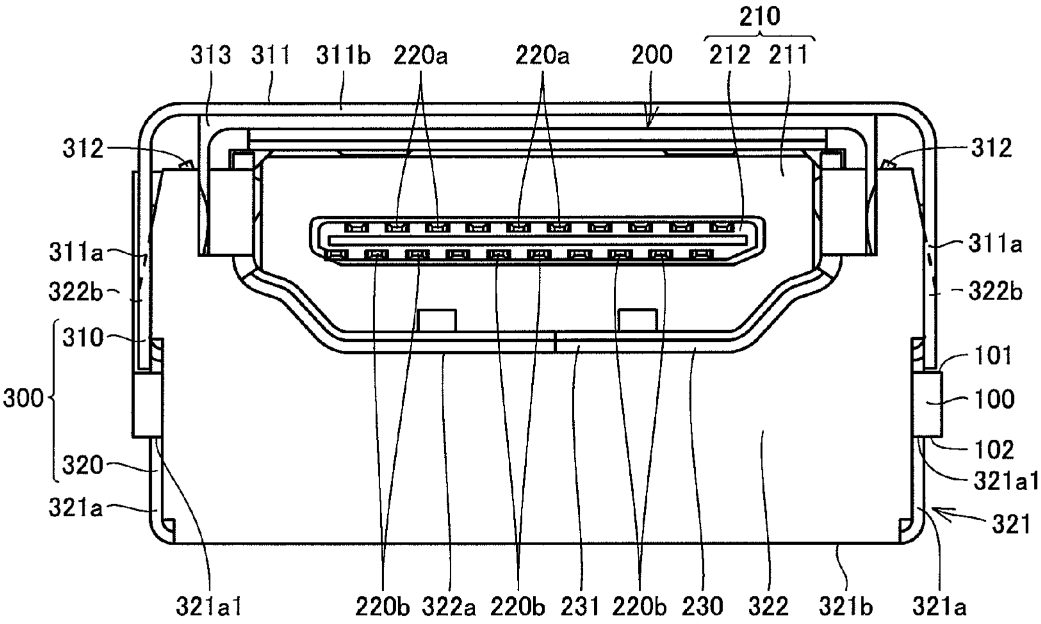
FIG. 3A is a schematic front view of the circuit board module with its resin case removed.
Figure 3B:
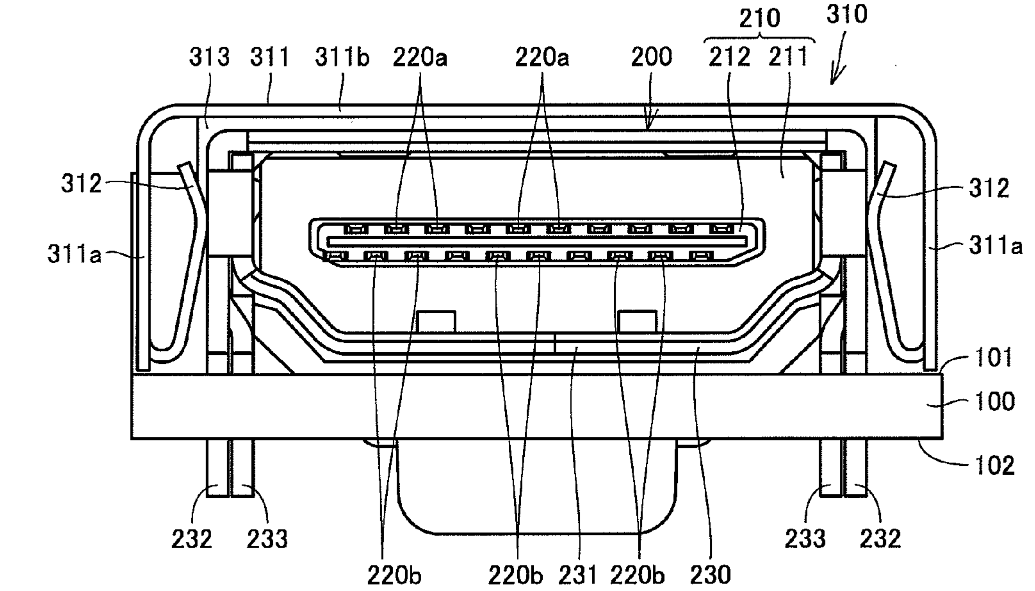
FIG. 3B is a schematic front view of the circuit board module with its shield member further removed.
Figure 4:
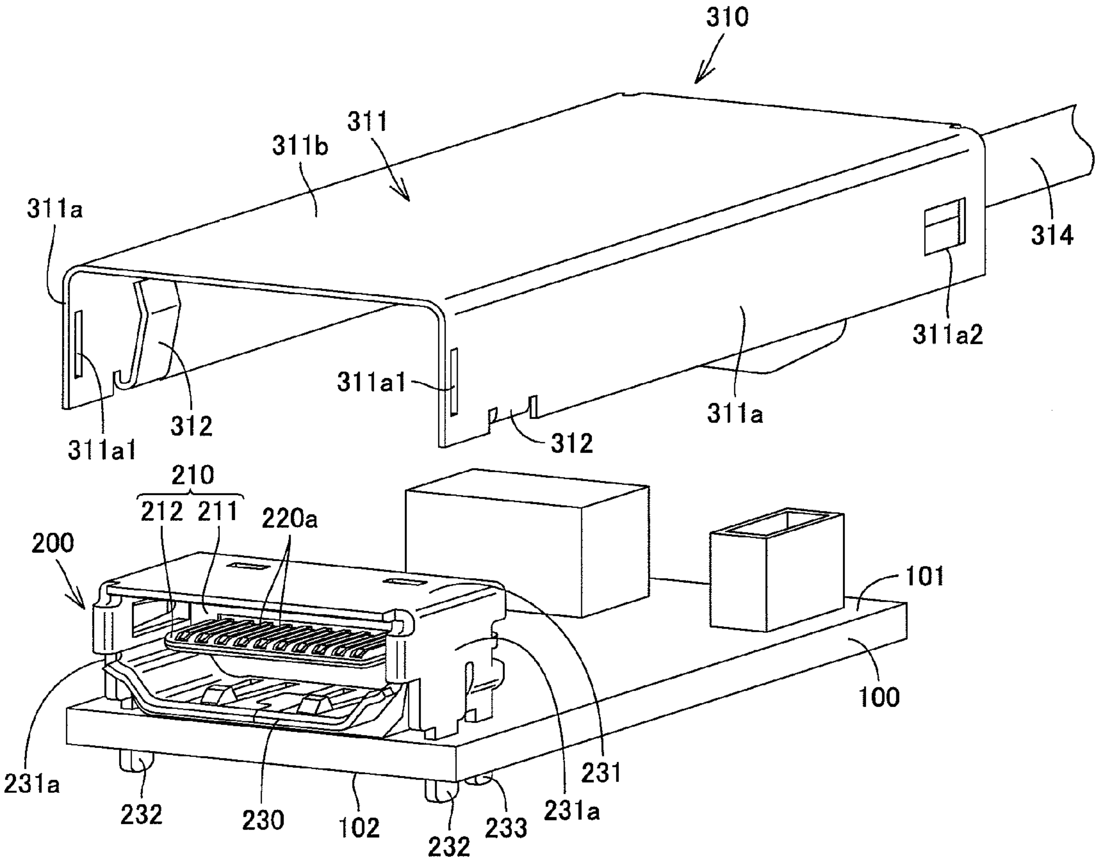
FIG. 4 is an exploded perspective view a circuit board, on which a connector is mounted, and a shield cover of the circuit board module.
Figure 5:
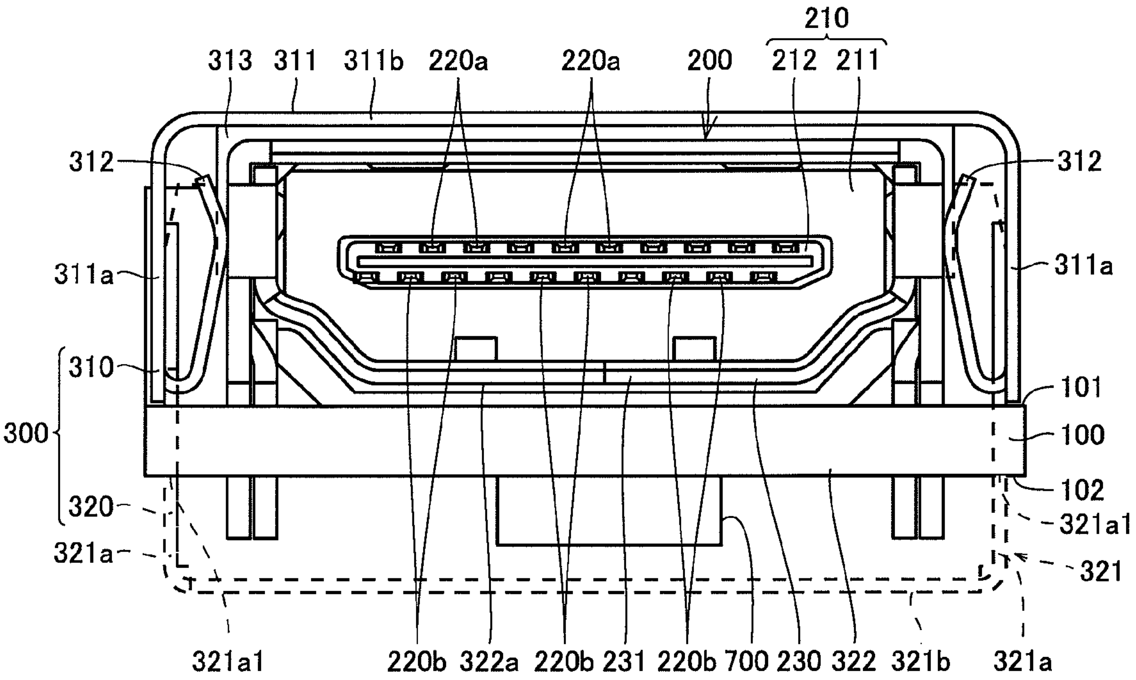
FIG. 5 is a schematic front view of a modified circuit board module, on a circuit board of which an electronic component is mounted.

The female connector 200 is designed to output digital signals. As shown in FIGS. 3A, 3B and 4, the female connector 200 has a body 210, the plurality of first and second contacts 220*a*, 220*b*, and a metal shell 230. The body 210, injection molded in insulating resin, has a base 211 and a projected portion 212. The projected portion 212 of a plate shape projects from the front of the base 211. The first and second contacts 220*a*, 220*b* each have an intermediate portion of a generally upside-down L shape, a distal end portion linearly extending continuously from an end of the intermediate portion, and a proximal end portion continued from the other end of the intermediate portion and folded at a right angle relative to the intermediate portion. The first contacts 220*a* are arranged such that their distal end portions are arrayed at intervals along an upper surface of the projected portion 212, that their intermediate portions are buried in the base 211, and that their proximal end portions are projected from the base 211. The second contacts 220*b* are arranged such that their distal end portions are arrayed at intervals along a lower surface of the projected portion 212, their intermediate portions are buried in the base 211, and their proximal end portions are projected from the base 211. The first contacts 220*a* and the second contacts 220*b*, are disposed with, their phases shifted as shown in FIG. 5. In other words, the distal end portions of the first contacts 220*a* and the second contacts 220*b* are arranged in a zigzag manner when seen from the front. FIGS. 3A, 3B, 4 and 5 show only the distal end portions of the first and second contacts 220*a*, 220*b*.

The metal shell 230 is fabricated by press-forming a conductive metal plate. As shown in FIGS. 3A, 3B and 4, the metal shell 230 has a rectangular tuboid shell body 231 and pairs of first and second locking pieces 232, 233 projecting downward from opposite ends of the shell body 231. The shell body 231 fittingly receives the base 211 of the body 210 from a rear-side opening of the shell body 231. In this fitted state, the projected portion 212 of the body 210 is located inside the shell body 231. The second locking pieces 233 are bent inward at their proximal end portions such that the distal end portions are located inwardly with respect to the first locking pieces 232. The first and second locking pieces 232, 233 are locked in first and second pairs of locking holes (not shown) formed through the circuit board 100 in the thickness direction. The proximal end portions of the first and second contacts 220*a*, 220*b* are connected by soldering to respective electrodes (not shown) that are provided on the first surface 101 of the circuit board 100 and connected to ends of the conductive lines. The female connector 200 is thus mounted on the first surface 101 of the circuit board 100. The shell body 231 has a front-side opening that serves as a connection port to fit over a mating male connector (not shown). When the mating male connector is fitted into the shell body 231, the shell body 231 comes into contact with a metal shell of the male connector to establish ground connection. Lateral surfaces 231*a* at opposite ends of the shell body 231 are recited as "lateral surfaces of a metal shell" in the claims.

The shield case 300, as shown in FIGS. 2A to 4, has a shield cover 310 for covering the first surface 101 of the circuit board 100 and a shield member 320 for covering the second surface 102 of the circuit board 100. The shield cover 310 is fabricated by press-forming a conductive metal plate. The shield cover 310 has a cover body 311 of a generally U shape in cross-sectional view, a pair of contact portions 312, a sealing plate 313, and a pair of sealing pieces 314. The cover body 311 has a pair of plate-like side walls 311*a* and a plate-like top plate 311*b* bridging between upper ends (first ends) of the side walls 311*a*. The distance between outer surfaces of the side walls 311*a* is substantially the same as a width dimension of the circuit board 100. Moreover, each length dimension of the side walls 311*a* and the top plate 311*b* is larger than a length dimension of the circuit board 100. Furthermore, a height dimension of the side walls 311*a* is slightly larger than a height dimension of the female connector 200. That is, the side walls 311*a* and the top plate 311*b* (forming the cover body 311 in combination) cover the first surface 101 of the circuit board 100 and the female connector 200. The top plate 311*b* is disposed close to the metal shell 230 of the female connector 200 with a slight clearance therebetween.

Moreover, the rear surface of the top plate 311*b* is provided continuously with the sealing plate 313, which is a plate body bent downward. The sealing plate 313 covers the rear side of the cover body 311. The sealing plate 313*a* is provided with a semi-cylindrical lead-out portion 313*a*. The lead-out portion 313*a*, together with a semi-cylindrical lead-out portion of the shield member 320, constitutes a cylindrical lead path to lead the cable 400 out the shield case 300. The lead path contacts and connects with an external conductor covering the lead wires at the end of the cable 400. Moreover, the sealing pieces

314 are provided continuously on rear ends of the side walls 311*a*. The sealing pieces 314 are plate bodies bent inward to abut an outer surface of the sealing plate 313. FIG. 4 shows a state before the sealing pieces 314 are bent.

Moreover, the pair of plate-like contact portions 312 is continuously provided at front end portions of lower ends (second ends) of the side walls 311*a* of the cover body 311. The contact portions 312 are folded back toward the top plate 311*b*. Distal end portions of the contact portions 312 are bent inward into generally V shapes. The distance between the apexes of the distal end portions is smaller than a width dimension of the shell body 231 of the metal shell 230 (i.e., a distance between the lateral surfaces 231*a* of the shell body 231). Accordingly, when the metal shell 230 is inserted between the distal end portions of the contact portions 312, the apexes of the distal end portions of the contact portions 312 come into elastic contact with the lateral surfaces 231*a* of the shell body 231 of the metal shell 230 and sandwich them. That is, the contact portions 312 are plate springs to elastically contact with the lateral surfaces 231*a* of the shell body 231 of the metal shell 230. Moreover, the side walls 311*a* have a pair of first locking holes 311*a*1 in their front end portions and a pair of second locking holes 311*a*2 in their rear end portions.

The shield member 320, fabricated by press-forming a conductive metal plate, has a main body 321 of a generally U shape in cross-sectional view, a front plate 322, and a back plate (not shown). The main body 321 has a pair of plate-like side walls 321*a*, and a plate-like bottom plate 321*b* bridging between lower ends of the side walls 321*a*. A distance between outer surfaces of the side walls 321*a* is substantially the same as the distance between the outer surfaces of the side walls 311*a* of the shield cover 310. Moreover, each length dimension of the side walls 321*a* and the bottom plate 321*b* is substantially the same as each length dimension of the side walls 311*a* and the top plate 311*b*. The side walls 321*a* have rectangular cutouts 321*a*1 as shown in FIG. 2A. Each depth dimension of the cutouts 321*a*1 is the same as a thickness dimension of the circuit board 100, and each length dimension of the cutouts 321*a*1 is slightly larger than the length dimension of the circuit board 100. The cutouts 321*a*1 fittingly receives widthwise ends of the circuit board 100, so that the main body 321 covers the second surface 102 of the circuit board 100.

The front plate 322 is a plate body extends continuously from the front end of the bottom plate 321*b* and bent upward. A height dimension of the front plate 322 is substantially the same as a distance from the top plate 311*b* of the shield cover 310 to the bottom plate 321*b* of the shield member 320. A central portion of an upper end portion of the front plate 322 is cut out. This cutout portion 322*a* conforms to the shape of the connection port of the connector 200. That is, the front plate 322 covers the front side of the main body 321, a front surface of the circuit board 100, and a portion of the connector 200 excluding the connection port. The connection port is allowed to be exposed through the cutout portion 322*a*. The back plate is a plate body extending continuously from the rear end of the bottom plate 321*b* and bent upward. The back plate covers the rear side of the main body 321 and a rear surface of the circuit board 100. As mentioned above, the back plate is provided with the a semi-cylindrical lead-out portion.

Widthwise ends of the front plate 322 are provided with a pair of first locking projections 322*b* projecting outward. Rear ends of the side walls 321*a* are provided with a pair of second locking projections 321*a*2 projecting outward. The first and second locking projections 322*b*, 321*a*2 are locked in the first and second locking holes 311*a*1, 311*a*2 of the side walls 311*a* of the shield cover 310. With these projections thus locked in the holes, the shield cover 310 and the shield member 320 are held together sandwiching the circuit board 100 therebetween. In other words, the shield cover 310 and the shield member 320 are locked to each other, in a state where the shield cover 310 covers the first surface 101 of the circuit board 100 and the shield member 320 covers the second surface 102 of the circuit board 100. The first and second locking projections 322*b*, 321*a*2 and the first and second locking holes 311*a*1, 311*a*2 are recited as "locking means" in the claims.

The resin case 600 has upper and lower cases 610, 620, as shown in FIG. 1. The upper and lower cases 610, 620 are injection molded in insulating resin and cover the shield case 300 when combined with each other. A front surface of the upper case 610 has an opening 611 to expose the connection port of the connector 200. A back surface of the upper case 610 has a lead-out hole (not shown) to lead out the cable 400.

The circuit board module having the above-described configuration is assembled in the following steps. First, the connector 200 is mounted on the first surface 101 of the circuit board 100, and the core wires of the cable 400 are connected by soldering to the respective input/output terminals on the first surface 101. The widthwise ends of the circuit board 100 are then placed into the cutouts 321*a*1 of the shield member 320. This allows the main body 321 of the shield member 320 to cover the second surface 102 of the circuit board 100, the front plate 322 of the shield member 320 to cover the front surface of the circuit board 100 and the surrounding area of the connection port of the connector 200, and the back plate of the shield member 320 to cover the rear surface of the circuit board 100. At the same time, the cable 400 is inserted into the lead-out portion of the back plate.

Thereafter, the shield cover 310 is placed over the circuit board 100, and the first and second locking holes 311*a*1, 311*a*2 of the side walls 311*a* of the shield cover 310 receive the first and second locking projections 322*b*, 321*a*2 of the shield member 320. As a result, the shield cover 310 is locked to the shield member 320 in the state where the shield cover 310 covers the first surface 101 of the circuit board 100 and the shield member 320 covers the second surface 102 of the circuit board 100. The combined shield cover 310 and shield member 320 form the shield case 300 that surrounds the whole circuit board 100. It should be noted that the metal shell 230 of the connector 200 mounted on the first surface 101 of the circuit board 100 is inserted between the pair of contact portions 312 of the shield cover 310, so that the lateral surfaces 231*a* of the metal shell 230 urge the contact portions 312 outward into elastic deformation (that is, the contact portions 312 are brought into elastic contact with the lateral surfaces 231*a* of the metal shell 230). Also, the lead-out portion 313*a* of the sealing plate 313 of the shield cover 310 is combined with the lead-out portion of the shield member 320 so as to cover a portion of the cable 400. Thereafter, the lead-out portion 313*a* of the shield cover 310 and the lead-out portion of the shield member 320 are caulked and brought into contact and electrical connection with the external conductor of the cable 400. Thereafter, the sealing pieces 314 are bent inward into abutment with the outer surface of the sealing plate 313.

Thereafter, the shield case 300 is placed inside the lower case 620. The lower case 620 is then combined with the upper case 610. The combined upper and lower cases, i.e. the resin case 600, thus accommodate the circuit board 100, the connector 200, and the shield case 300. At this time, the connection port of the metal shell 230 of the connector 200 is exposed through the opening 611 of the upper case 610, and the cable 400 is led out through the lead hole of the resin case 600.

The circuit board module as described above has many advantageous features over the conventional art. First, it is possible to connect the metal shell 230 of the female connector 200, the shield cover 310 and the shield member 320 at a time, simply by placing the shield cover 310 over the circuit board 100, locking the first and second locking projections 322*b*, 321*a*2 of the shield member 320 into the first and second locking holes 311*a*1, 311*a*2 of the side walls 311*a* of the shield cover 310, and bringing the pair of contact portions 312 of the shield cover 310 into elastic contact with the lateral surfaces 231*a* of the metal shell 230 of the female connector 200 mounted on the circuit board 100. This configuration remarkably simplifies the connection work of the contact portions 312 with the metal shell 230, leading to reduced assembly cost of the circuit board module. Second, the contact portions 312 are adapted to elastically contact with the lateral surfaces 231*a* of the metal shell 230 to sandwich the metal shell 230, so that electric connection between the contact portions 312 and the metal shell 230 is improved in stability and reliability. Third, as the contact portions 312 make elastic contact with the lateral surfaces 231*a* of the metal shell 230, the top plate 311*b* of the shield cover 310 can be disposed close to the female connector 200, contributing to reduction in height dimension of the circuit board module.

The circuit board module is also advantageous because of the minimized number of components. More particularly, the shield cover 310 and the shield member 320 are adapted to be locked to each other, with the circuit board 100 sandwiched therebetween, simply by locking the first and second locking projections 322*b*, 321*a*2 of the shield member 320 into the first and second locking holes 311*a*1, 311*a*2 of the side walls 311*a* of the shield cover 310. It is thus possible to omit additional locking means for locking the shield cover 310 and the shield member 320 to the circuit board 100, reducing the number of components and resulting in reduced cost of the circuit board module. Further, as the circuit board 100 has no locking holes or the like for locking the shield cover 310 and the shield member 320 to the circuit board 100, it should obviate the need to reserve the space for forming the locking holes or the like in the circuit board 100. Consequently, the circuit board 100 can be downsized, and the circuit board module can be accordingly downsized.

Lastly, the contact portions 312, being plate springs that are extended from the lower ends of the side walls 311*a* of the cover body 311 of the shield cover 310 and folded back toward the top plate 311*b*, has another advantageous feature over the conventional art. Particularly, compared to a conventional case where the contact portions are formed by cutting out and raising portions of the cover body such that cutout portions are formed in the cover body, the circuit board module having the above described contact portions 312 is less likely to leak electromagnetic waves occurring from the female connector 200 and other components from the shield cover 310.

The above-described circuit board module is not limited to the above embodiment but may be modified in design as desired within the range of the claims. Modification examples will be described in detail below.

The shield case 300 of the above embodiment has the shield cover 310 and the shield member 320, but the present invention is not limited thereto. The invention only requires a shield cover that covers the first surface 101 of the circuit board 100 if the electronic components, such as the female connector 200 and an IC, and the conductive lines are provided only on the first surface 101 of the circuit board 100. The above-described shield cover 310 is shaped to cover the first surface 101 of the circuit board 100, but the shield cover may be modified in shape as needed, as long as it has such a shape as to cover at least the connector such as the female connector 200 on the first surface 101 of the circuit board 100. Moreover, the shield member 320 has such a shape as to cover the second surface 102 of the circuit board 100, but the present invention is not limited thereto. For example, in a case as shown in FIG. 5 where an electronic component 700 is mounted on the second surface 102 of the circuit board 100, the shield member may have such a shape as to cover at least the electronic component.

Moreover, the shield cover 310 and the shield member 320 of the above embodiment are each formed by press-forming a conductive metal plate, but the present invention is not limited thereto. For example, the shield cover and/or the shield member may be fabricated based on a housing made of insulating resin or ceramics, on inner surfaces of which a conductive thin film may be formed or conductive metal may be deposited. Alternatively, the shield cover and/or the shield member may be cast in conductive metal.

The locking means for locking the shield cover 310 to the shield member 320 may or may not be the first and second locking holes 311*a*1, 311*a*2 and the first and second locking projections 322*b*, 321*a*2 used in the above embodiment. For example, the first and second locking projections 322*b*, 321*a*2 may be provided on the side walls 311*a* of the shield cover 310, and the first and second locking holes 311*a*1, 311*a*2 may be provided in the side walls 321*a* of the shield member 320. Alternatively, the side walls 311*a* and the side walls 321*a* may be formed with locking holes communicating to each other to receive pins or screws therethrough. Moreover, the shield cover 310 and the shield member 320 may be locked to the circuit board 100 as the metal shell 230 is.

The shield cover 310 has the pair of contact portions 312 in the above embodiment, but it only needs to have at least one contact portion 312. Moreover, the contact portion 312 is not limited to a plate spring extended from the lower end of a side wall 311*a* of the cover body 311 and folded back, but the contact portion may be modified in design as needed as long as it is elastically contactable from a side with a lateral surface 231*a* of the metal shell 230. For example, the contact portion may be a circular arc-shaped metal plate, a coil spring, a body made of conductive elastic resin or the like, and it may be attached to an inner side surface of a side wall 311*a* of the cover body 311.

Figure 6:
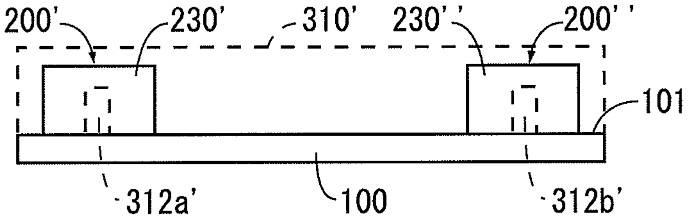
FIG. 6 is a schematic side view of another modified circuit board module, on a circuit board of which two types of connectors are mounted.

The female connector 200 in the above embodiment is adapted to output digital signals, the female connector 200 may be a female or male connector adapted to input or input/output signals. Moreover, in the circuit board module of the above embodiment, only the female connector 200 is mounted on the first surface 101 of the circuit board 100, but the invention is not limited thereto and two or more types of connectors may be mounted. For example, FIG. 6 illustrates a modified module, wherein a female connector 200' is mounted on a front end portion of the first surface 101 of the circuit board 100, and a male connector 200" is mounted on a rear end portion of the first surface 101. In this modified module as well, a shield cover 310' covers the first surface 101 of the circuit board 100, and first and second contact portions 312*a*', 312*b*' of the shield cover 310' are brought into elastic contact with lateral surfaces of a metal shell 230' of the female connector 200' and a metal shell 230" of the male connector 200", respectively. Obviously, the first and second contact portions 312*a*', 312*b*' may also be provided in pairs to sandwich the lateral surfaces of the metal shell 230' of the female connector 200' and the lateral surfaces of the metal shell 230" of the male connector 200", respectively. It is also possible to provide a plurality of connectors of the same type to be mounted on the first surface 101 of the circuit board 100. If a plurality of or a plurality of types of connectors are mounted on the circuit board 100, cables 400 (led out from the respective first electronic components) may be connected to the circuit board 100. Moreover, the core wires of the cable 400 may be connected to the input/output terminals of the circuit board 100, but they may be connected directly to the connector such as the female connector 200.

The cable 400 and the male connector 500 may be omitted as in the case shown in FIG. 6. Moreover, the resin case 600 may also be omitted, especially in the case where the connector, such as the connector of the present circuit board module, is used as an interface for electronic equipment or the like.

Materials, shapes, numbers, dimensions and the like constructing the respective portions of the circuit board module in the above embodiment have been described only as examples, and they may be modified as desired as long as they can realize similar functions. Moreover, the present invention is not limited to the relay device as in the above embodiment, but the invention can be applied to various circuit board modules, such as the above-described interface for electronic equipment.

| Reference Signs List | |
|---|---|
| 100 | circuit board |
| 101 | first surface |
| 102 | second surface |
| 200 | female connector |
| 210 | body |
| 220a | first contact |
| 220b | second contact |
| 230 | metal shell |
| 231a | lateral surface |
| 300 | shield case |
| 310 | shield cover |
| 311 | cover body |
| 311a | side wall portion |
| 311a1 | first locking hole (locking means) |
| 311a2 | second locking hole (locking means) |
| 311b | top plate |
| 312 | contact portion |
| 320 | shield member |
| 321a2 | second locking projected portion (locking means) |
| 322b | first locking projected portion (locking means) |
| 400 | cable |
| 500 | male connector |
| 600 | resin case |

The invention claimed is:

1. A shield cover, to cover at least a connector mounted on a first surface of a circuit board, the connector having a metal shell, the shield cover comprising:
a contact portion being elastically contactable with a first lateral surface of the metal shell of the connector; and
a cover body of a generally U shape in cross-sectional view, wherein
the cover body includes a pair of side walls, each of which has first and second ends, and a top plate bridging between the first ends of the side walls, and
the contact portion comprises a plate spring extended from the second end of one of the side walls of the cover body and folded back toward the top plate of the cover body.

2. The shielding cover according to claim 1, having a shape to cover the first surface of the circuit board.

3. A shield case comprising:
the shield cover according to claim 1; and
a shield member to cover a second surface of the circuit board, the second surface being an opposite surface to the first surface of the circuit board.

4. The shield case according to claim 3, further comprising locking means for locking the shield cover to the shield member with the circuit board sandwiched there between.

5. A circuit board module comprising:
the shield case according to claim 3;
the connector having the metal shell; and
the circuit board having the first surface on which the connector is mounted.

6. The circuit board module according to claim 5, wherein the connector is a female or male connector.

7. The circuit board module according to claim 6, further comprising a cable, the cable being connected to the connector or connected to the connector via a conductive line on the circuit board.

8. The circuit board module according to claim 5, wherein
the connector comprises at least two connectors that are mounted on the first surface of the circuit board, and
one of the connectors is a female connector, and the other connector is a male connector.

9. The circuit board module according to claim 5, further comprising a case made of insulating resin and to cover the shield case.

10. A shield case comprising:
the shield cover according to claim 1; and
a shield member to cover at least an electronic component mounted on a second surface of the circuit board, the second surface being an opposite surface to the first surface of the circuit board.

11. The shield case according to claim 10, further comprising locking means for locking the shield cover to the shield member with the circuit board sandwiched there between.

12. A circuit board module comprising:
the shield case according to claim 10;
the connector having the metal shell;
the electronic component; and
the circuit board having the first surface on which the connector is mounted and the second surface on which the electronic component is mounted, the second surface being an opposite surface to the first surface of the circuit board.

13. The circuit board module according to claim 12, wherein the connector is a female or male connector.

14. The circuit board module according to claim 13, further comprising a cable, the cable being connected to the connector or connected to the connector via a conductive line on the circuit board.

15. The circuit board module according to claim 12, wherein
the connector comprises at least two connectors that are mounted on the first surface of the circuit board, and
one of the connectors is a female connector, and the other connector is a male connector.

16. The circuit board module according to claim 12, further comprising a case made of insulating resin and to cover the shield case.

17. A circuit board module comprising:
the shield cover according to claim 1;
the connector having the metal shell; and
the circuit board having the first surface on which the connector is mounted.

18. The circuit board module according to claim 17, wherein the connector is a female or male connector.

19. The circuit board module according to claim 18, further comprising a cable, the cable being connected to the connector or connected to the connector via a conductive line on the circuit board.

20. The circuit board module according to claim 17, wherein the connector comprises at least two connectors that axe mounted on the first surface of the circuit board, and one of the connectors is a female connector, and the other connector is a male connector.

21. The circuit board module according to claim 17, further comprising a case made of insulating resin and to cover the shield case.

22. A shield cover, to cover at least a connector mounted on a first surface of a circuit board, the connector having a metal shell, the shield cover comprising;

a pair of contact portions: and a cover body of a generally U shape in cross-sectional view, wherein the metal shell includes a first lateral surface and a second lateral surface that is opposite from the first lateral surface, a distance between the contact portions is smaller than a distance between the first and second lateral surfaces, the cover body includes a pair of side walls, each of which has first and second ends, and a top plate bridging between the first ends of the side walls, and the contact portion comprises a plate spring extended from the second end of one of the side walls of the cover body and folded back toward the top plate of the cover body.

23. The shield cover according to claim 22, having a shape to cover the first surface of the circuit board.

24. A shield case comprising:

the shield cover according to claim 22; and a shield member to cover a second surface of the circuit board, the second surface being an opposite surface to the first surface of the circuit board.

25. A shield case comprising:

the shield cover according to claim 22; and a shield member to cover at least an electronic component mounted on a second surface of the circuit board, the second surface being an opposite surface to the first surface of the circuit board.

26. A shield case comprising:

the shield cover according to claim 22;

the connector having the metal shell; and the circuit board having the first surface on which the connector is mounted.

* * * * *